United States Patent [19]

Harmuth

[11] Patent Number: 4,576,736
[45] Date of Patent: Mar. 18, 1986

[54] METHOD OF PREDICTING AND CONTROLLING THE VISCOSITY OF CONDUCTIVE PASTES

[75] Inventor: Ann P. Harmuth, Poughkeepsie, N.Y.

[73] Assignee: International Business Machines Corporation, Armonk, N.Y.

[21] Appl. No.: 591,074

[22] Filed: Mar. 19, 1984

[51] Int. Cl.$^4$ .............................................. H01B 3/02
[52] U.S. Cl. ................................. 252/512; 241/46.17
[58] Field of Search .................... 73/54.38; 241/46.17; 106/1.05, 1.18; 252/512

[56] References Cited

U.S. PATENT DOCUMENTS

| | | | |
|---|---|---|---|
| 4,191,789 | 3/1980 | Brown et al. | 427/97 |
| 4,207,369 | 6/1980 | Kazmierowicz | 252/512 |
| 4,218,248 | 8/1980 | Snyder et al. | 106/1.12 |
| 4,493,789 | 1/1985 | Vegama et al. | 252/512 |

FOREIGN PATENT DOCUMENTS

| | | | |
|---|---|---|---|
| 121996 | 9/1979 | Japan | 252/512 |
| 23664 | 2/1982 | Japan | 252/512 |
| 808995 | 2/1959 | United Kingdom | 73/38 |

OTHER PUBLICATIONS

IBM TDB, vol. 19, No. 9, Feb. 1977, "Viscosity Stabilizer for High Adhesion Metallizing Pastes", D. L. Gorton, H. D. Kaiser & J. B. Rizzuto, p. 3386.

May 1972 Solid State Technology, "A Fabrication Technique for Multilayer Ceramic Modules", H. D. Kaiser, F. J. Pakulski & A. F. Schmeckenbecher, pp. 35–40.

Fisher Model 95 Sub-Sieve Sizer, Fisher Scientific Co., pp. 1–31.

American National Standard, ASTM B430-79, "Standard Method for Particle Size Distribution of Refractory Metal-Type Powders by Turbidimetry", pp. 202–206.

American National Standard, ASTM B 330-76, "Standard Test Method for Average Particle Size of Powders of Refractory Metals & Compounds" by the Fisher Sub-Sieve Sizer, pp. 151–154.

Primary Examiner—Bernard Nozick
Attorney, Agent, or Firm—Wolmar J. Stoffel

[57] ABSTRACT

The viscosity of molybdenum paste may be predicted and controlled, by measuring and altering, respectively, the particle packing density of the molybdenum powder used in the paste. For a given vehicle, there is a low correlation between average particle size and paste viscosity, but a high direct correlation between particle packing size and paste viscosity.

3 Claims, 4 Drawing Figures

METHOD OF PREDICTING AND CONTROLLING THE VISCOSITY OF CONDUCTIVE PASTES

BACKGROUND OF THE INVENTION

1. Technical Field

This invention relates to the manufacture of conductive pastes and more particularly to a method of predicting and controlling the viscosity of conductive pastes in order to provide manufacturing uniformity.

Conductive pastes comprising a conductive (typically metal) powder suspended in a carrier (typically an organic vehicle), are widely used in the fabrication of electronic components. For example, conductive molybdenum paste is used to fabricate multilayer ceramic integrated circuit substrates, as described in "A Fabrication Technique for Multilayer Ceramic Modules", H. D. Kaiser et al., Solid State Technology, May 1972, pp. 35–40. Conductive molybdenum paste comprises molybdenum powder, having a predetermined average or mean particle size, suspended in an organic vehicle. The organic vehicle may include a binder resin, e.g., Ethyl Cellulose, a solvent, e.g., 2-(2-Butoxy ethoxy) Ethyl Acetate and a wetting agent or other additive, e.g., Oleoyl Sarcosine.

2. Background Art

The multilayer ceramic substrate fabrication process requires the viscosity of the molybdenum paste to be precisely controlled. Unfortunately, it was found that large viscosity variations exist in molybdenum pastes formed from molybdenum powders having the same average particle size and the identical vehicle. It was also found that in order to obtain the requisite paste viscosity, the vehicle viscosity may be changed by a trial and error procedure. For example, low and high viscosity vehicle may be formulated, e.g., with low and high molecular weight ethyl cellulose, respectively, and may be mixed in various proportions until the requisite paste viscosity is obtained. Such a trial and error process is time consuming and requires constant supervision because of its unpredictability. It was also found that changes in vehicle viscosity may produce other undesirable side effects in the resulting paste, e.g., excessive paste bleed. Accordingly, production of molybdenum paste having a predetermined viscosity from different lots of molybdenum powder having the same average particle size was heretofore a trial and error process which was not amenable to mass production.

DISCLOSURE OF THE INVENTION

It is therefore a primary object of the invention to provide a method of predicting and controlling the viscosity of conductive pastes.

It is another object of the invention to provide a method of controlling the viscosity of conductive pastes without changing the viscosity of the organic vehicle.

It is yet another object of the invention to provide a method of controlling the viscosity of conductive pastes in a repeatable manner, without trial and error experimentation.

According to the invention, the viscosity of conductive molybdenum paste may be predicted and controlled, by measuring and altering, respectively, the porosity of the molybdenum powder used in the paste. According to the invention, it was found that for a given viscosity vehicle there is a very high direct correlation between the porosity of the molybdenum powder and the viscosity of the resultant molybdenum paste. Porosity, also referred to as particle packing density, is defined as the ratio of air space to the total volume of the powder, and may vary for molybdenum powders having the same average particle size. Accordingly, the viscosity of conductive molybdenum paste may be predicted by measuring the particles packing density of the molybdenum powder used in the paste, using well known particle packing density measuring techniques. Viscosity may be controlled by maintaining the particle packing density within a specified range of the required particle packing density. Moreover, the particle packing density of molybdenum powder having out of specification particle packing density may be altered to that required, using rod milling or other well known techniques.

Although the invention is described herein with regard to molybdenum pastes it may also be employed during the manufacture of other conductive pastes, e.g., copper paste.

DETAILED DESCRIPTION OF THE INVENTION

Figure 1:
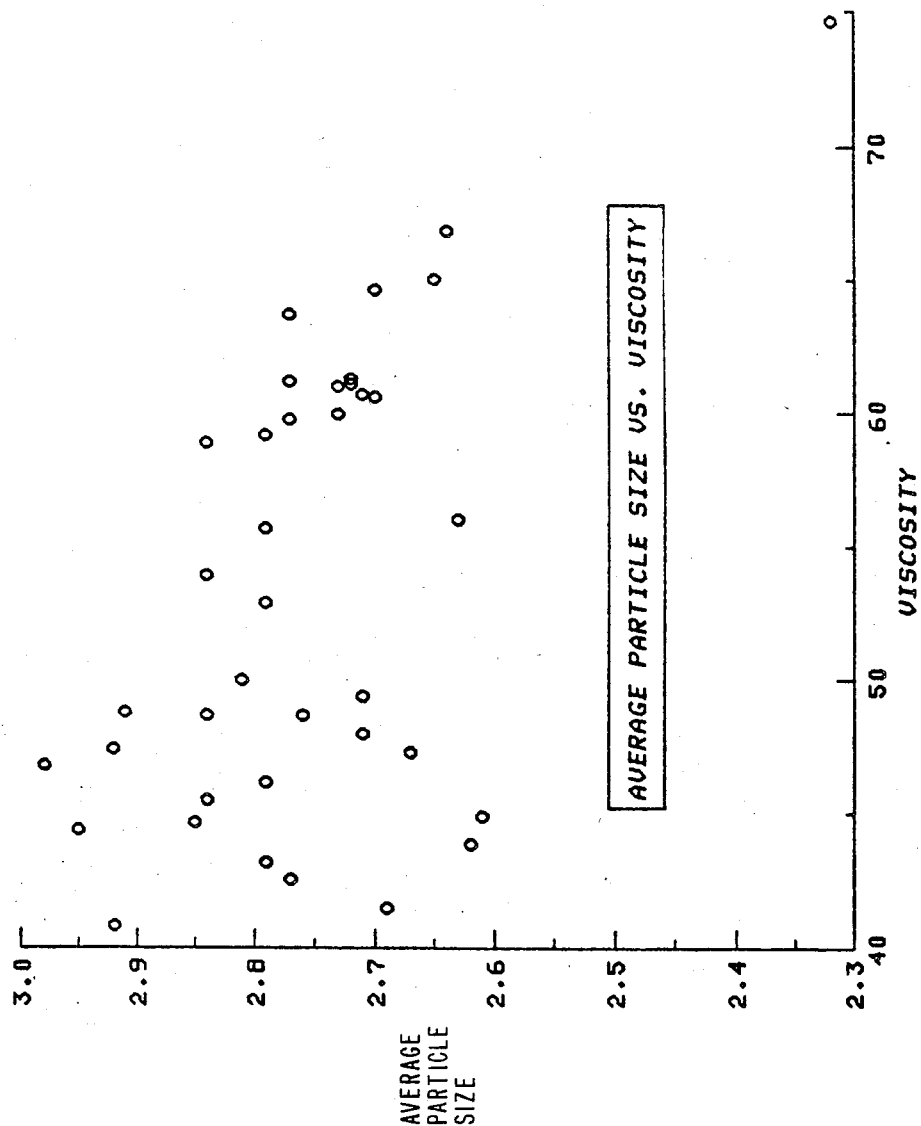
FIG. 1 is a graph of molybdenum powder average particle size versus molybdenum paste viscosity.

Referring now to FIG. 1, there is illustrated a graph of molybdenum powder average particle size (measured in units of microns) versus molybdenum paste viscosity (measured in units of Pasal.seconds). Each point in FIG. 1 corresponds to a measurement for one lot of molybdenum powder (each lot being a sample from a fifty pound container of molybdenum powder, suspended in the identical vehicle. As illustrated in FIG. 1 there is little correlation between average particle size and the resultant paste viscosity. Moreover, for a given average particle size, it may be seen that viscosity varies in an apparently random and unpredictable manner. For example, for average particle size of 2.8 microns, measured viscosity ranged from 43–65 Pa.s. This unpredictable viscosity makes mass production of molybdenum paste difficult, and was heretofore corrected by adjusting the vehicle viscosity by trial and error.

Figure 2:
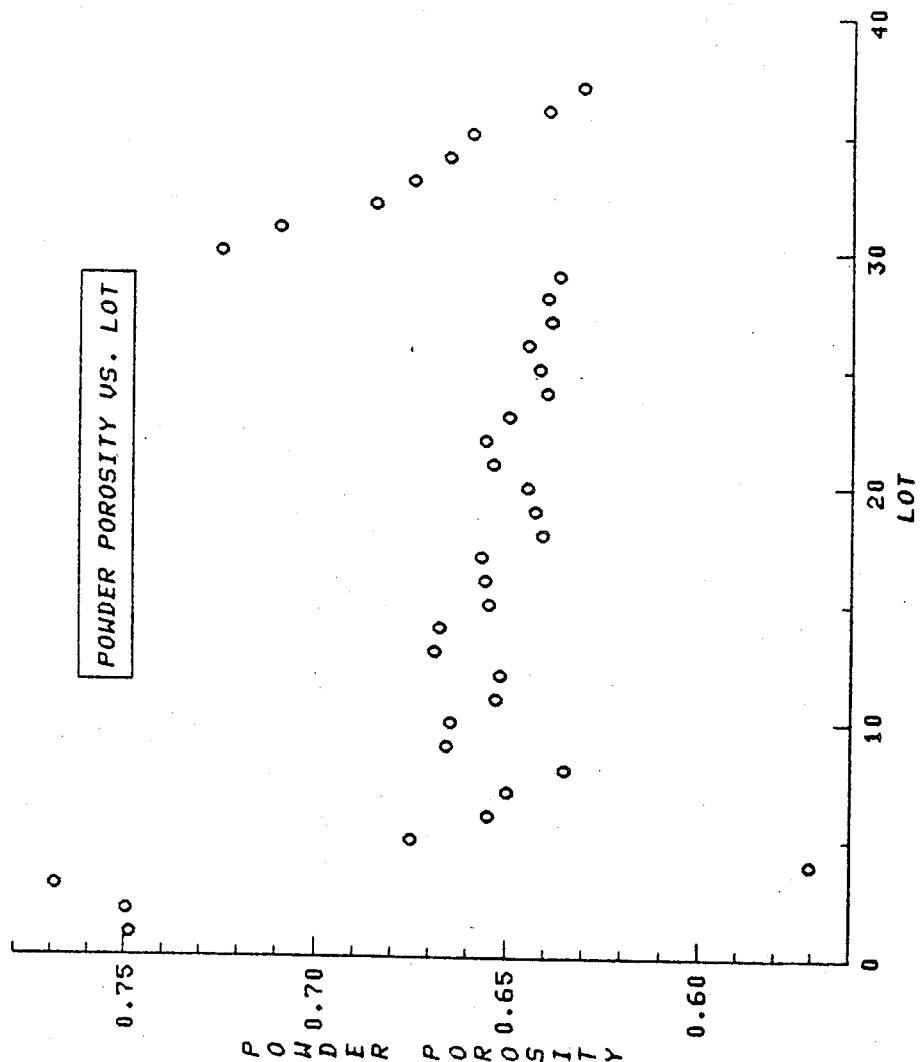
FIG. 2 is a graph of molybdenum powder porosity for molybdenum powder having the same average particle size.

Referring now to FIG. 2, there is illustrated a graph of molybdenum powder porosity for 37 lots of molybdenum powder having the same average particle size (here 2.8 microns). It may be seen that for a given powder particle size the porosity may vary from about 0.64–0.76.

Figure 3:
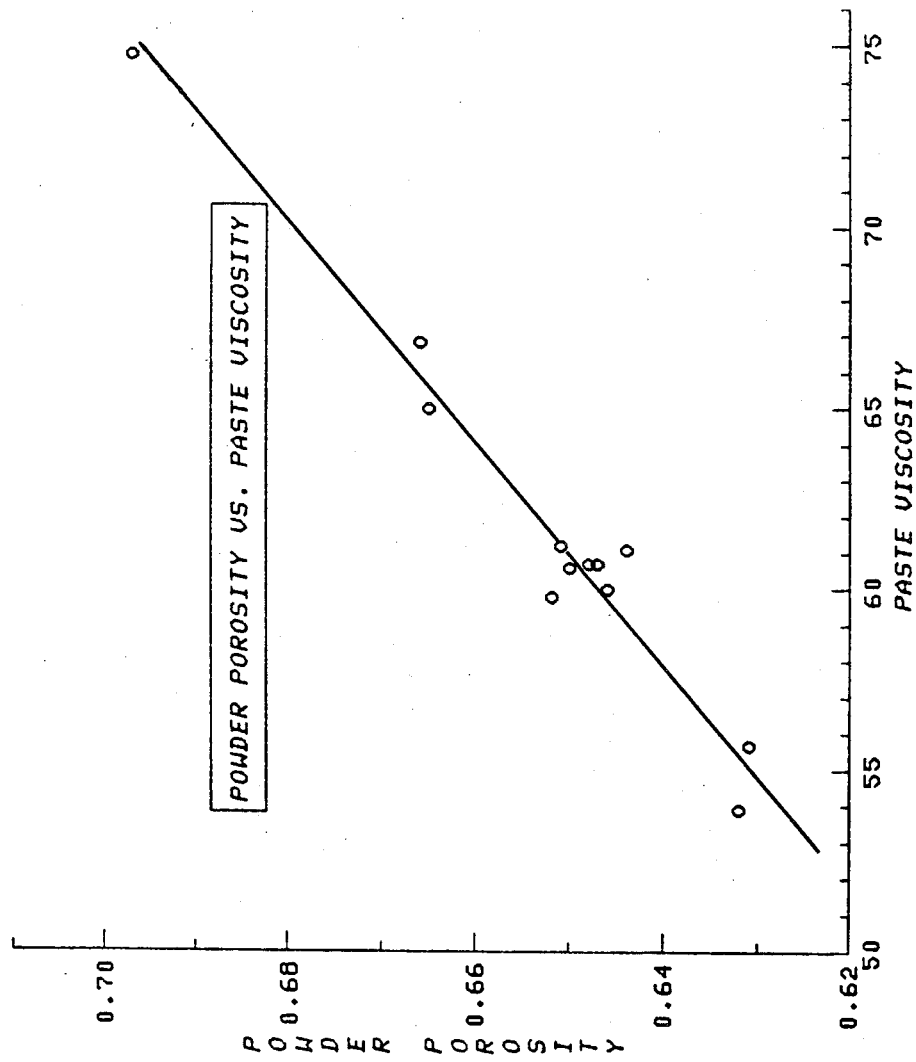
FIG. 3 is a graph of molybdenum powder porosity versus molybdenum paste viscosity.

Although the above porosity range may seem insignificantly narrow, it was determined, according to the invention that a high correlation exists between powder porosity and past viscosity for a given viscosity vehicle. This relationship is illustrated in FIG. 3 which graphs powder porosity versus paste viscosity. Each point in FIG. 3 corresponds to a measurement for one lot of molybdenum powder suspended in the identical vehicle. Because of this high correlation, molybdenum paste viscosity may be controlled according to the invention by measuring the porosity of the molybdenum powder, ensuring that all molybdenum powder conforms to the requisite porosity.

It will be recognized by those having skill in the art that particle porosity may be measured by well known techniques, e.g., with a Fisher Model 95 Sub-Sieve Sizer manufactured by the Instrument Division of Fisher Scientific Company, Pittsburg, Pa. As is well known by those having skill in the art, the Fisher Sub-Sieve Sizer operates on the air permeability principle for measuring the average particle size of powders. The principle employs the fact that particles in the path of a regulated air flow will effect that air flow in relationship to their size. The standard method of measuring average particle size using the Fisher Sub-Sieve Sizer is described in Americal National Standard ASTM B 330-76 entitled "Standard Test Method for Average Particle Size of Powders of Refractory Metals and Compounds by the Fisher Sub-Sieve Sizer", pages 151–154, 1976. In ASTM B 330, a formula for calculating porosity from the manometer height read from the Fisher Sub-Sieve Sizer is given as:

$$\text{Porosity} = \frac{LA - M/D}{LA}$$

where;

L = sample height after compaction, cm;
A = cross sectional area of the sample tube, = 1.267 cm$^2$;
M = weight of sample, g;
D = true density of material being tested, g/cm$^3$.

It will be understood by those skilled in the art that other methods of measuring porosity may be employed.

Figure 4:
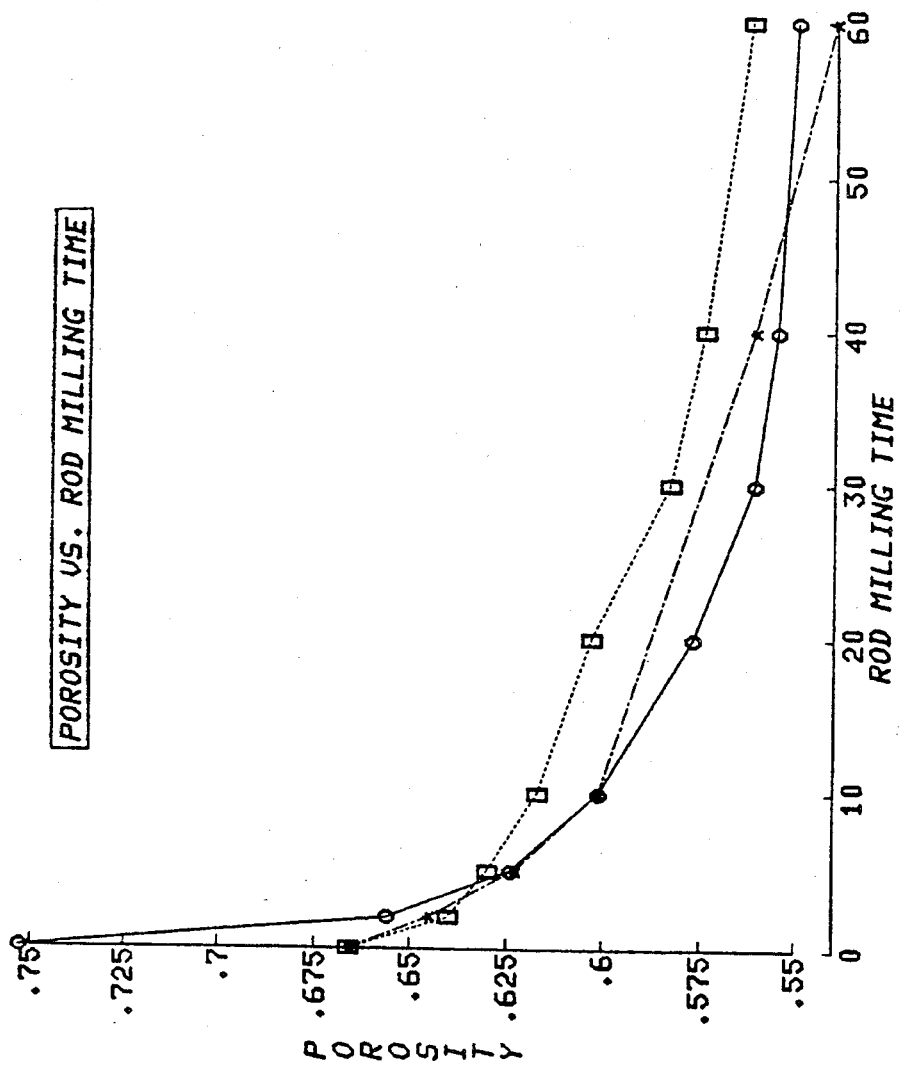
FIG. 4 is a graph of molybdenum powder porosity versus rod milling time.

It will also be understood by those having skill in the art that if the porosity of molybdenum powder is outside the range that will yield the proper molybdenum paste viscosity, a porosity may be altered, e.g., using a well known rod milling technique. Rod milling is described in Americal National Standard ASTM B 430-79 entitled "Standard Test Method for Particle Size Distribution of Refractory Metal-Type Powders by Turbidimetery", pages 202–206, 1979. Section 7 of ASTM B 430-79 described the method of deagglomerating powder by placing the powder in a glass milling bottle, containing 50 tungsten rods, and rotating on a roll mill. Referring to FIG. 4, there is illustrated the change in powder porosity for three lots of powder milled under the above described conditions. It will be seen that the porosity of the molybdenum powder can be reduced to that required by rod milling for a predetermined time. Thus, for example, with incoming porosity of 0.675, the porosity may be reduced to 0.600 by rod milling for about ten minutes. Up to 60 minutes of milling will not change the average particle size. A family of curves for various starting porosities may be generated and employed to determine the rod milling time necessary to reduce the porosity to that required. It will be understood by those having skill in the art that other means of reducing porosity may be employed.

While the invention has been particularly shown and described with reference to a preferred embodiment thereof, it will be understood by those skilled in the art that various changes in form and details may be made without departing from the spirit and scope of the invention.

I claim:

1. A method of formulating conductive metal paste having a predetermined viscosity comprising the steps of:

providing an organic vehicle having a predetermined viscosity;

providing a conductive metal powder having a predetermined average particle size;

developing a directly proportional correlation between packing density of said conductive metal powder and the paste viscosity of a paste of said conductive metal powder, suspended in said organic vehicle, milling the said conductive powder to make its packing density conform to the packing density necessary to produce said predetermined viscosity of the paste to be formulated as determined by said correlation, and mixing the organic vehicle and the conductive metal powder having decreased particle packing density.

2. The method of claim 1 wherein said powder is molybdenum powder.

3. The method of claim 1 wherein said powder is copper powder.

* * * * *